(12) United States Patent
Li et al.

(10) Patent No.: US 9,165,489 B2
(45) Date of Patent: Oct. 20, 2015

(54) CMP COMPOSITIONS SELECTIVE FOR OXIDE OVER POLYSILICON AND NITRIDE WITH HIGH REMOVAL RATE AND LOW DEFECTIVITY

(71) Applicant: Cabot Microelectronics Corporation, Aurora, IL (US)

(72) Inventors: Tina Li, Warrenville, IL (US); Kevin Dockery, Aurora, IL (US); Renhe Jia, Naperville, IL (US); Jeffrey Dysard, St. Charles, IL (US)

(73) Assignee: Cabot Microelectronics Corporation, Aurora, IL (US)

( * ) Notice: Subject to any disclaimer, the term of this patent is extended or adjusted under 35 U.S.C. 154(b) by 0 days.

(21) Appl. No.: 14/289,728

(22) Filed: May 29, 2014

(65) Prior Publication Data

US 2014/0349483 A1    Nov. 27, 2014

Related U.S. Application Data

(63) Continuation-in-part of application No. 13/898,842, filed on May 21, 2013, now Pat. No. 8,906,252.

(51) Int. Cl.
| | |
|---|---|
| *C09K 13/00* | (2006.01) |
| *G09G 1/02* | (2006.01) |
| *H01L 21/3105* | (2006.01) |
| *C09K 3/14* | (2006.01) |

(52) U.S. Cl.
CPC .............. *G09G 1/02* (2013.01); *C09K 3/1463* (2013.01); *H01L 21/31053* (2013.01)

(58) Field of Classification Search
USPC ............... 216/89; 438/693; 451/41; 252/79.1
See application file for complete search history.

(56) References Cited

U.S. PATENT DOCUMENTS

| | | | |
|---|---|---|---|
| 5,196,353 A | 3/1993 | Sandhu et al. | |
| 5,433,651 A | 7/1995 | Lustig et al. | |
| 5,609,511 A | 3/1997 | Moriyama et al. | |
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,872,633 A | 2/1999 | Holzapfel et al. | |
| 5,893,796 A | 4/1999 | Birang et al. | |
| 5,949,927 A | 9/1999 | Tang | |
| 5,964,643 A | 10/1999 | Birang et al. | |
| 6,626,968 B2 | 9/2003 | Park et al. | |
| 8,314,028 B2 | 11/2012 | Hong et al. | |
| 2007/0218811 A1 | 9/2007 | Kurata et al. | |
| 2011/0269305 A1 | 11/2011 | Chandrasekaran | |
| 2012/0270399 A1* | 10/2012 | Shin et al. | 438/692 |
| 2013/0059439 A1 | 3/2013 | Shinoda et al. | |
| 2014/0346140 A1* | 11/2014 | Dockery et al. | 216/38 |

FOREIGN PATENT DOCUMENTS

| | | |
|---|---|---|
| EP | 1 541 653 A1 | 6/2005 |
| WO | WO 2007/135704 A1 | 11/2007 |

OTHER PUBLICATIONS

Lee et al., "Effects of Nonionic Surfactants on Oxide-to-Polysilicon Selectivity during Chemical Mechanical Polishing," *Journal of the Electrochemical Society*, 149(8): G477-G481 (Aug. 2002).

* cited by examiner

*Primary Examiner* — Roberts Culbert
(74) *Attorney, Agent, or Firm* — Thomas Omholt; Arlene Hornilla

(57) ABSTRACT

The invention provides a chemical-mechanical polishing composition containing a ceria abrasive and a polymer of formula I:

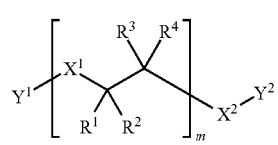

wherein $X^1$ and $X^2$, $Y^1$ and $Y^2$, $Z^1$ and $Z^2$, $R^1$, $R^2$, $R^3$, and $R^4$, and m are as defined herein, and water, wherein the polishing composition has a pH of about 1 to about 4.5. The invention further provides a method of chemically-mechanically polishing a substrate with the inventive chemical-mechanical polishing composition. Typically, the substrate contains silicon oxide, silicon nitride, and/or polysilicon.

21 Claims, No Drawings

CMP COMPOSITIONS SELECTIVE FOR OXIDE OVER POLYSILICON AND NITRIDE WITH HIGH REMOVAL RATE AND LOW DEFECTIVITY

BACKGROUND OF THE INVENTION

Compositions and methods for planarizing or polishing the surface of a substrate are well known in the art. Polishing compositions (also known as polishing slurries) typically contain an abrasive material in a liquid carrier and are applied to a surface by contacting the surface with a polishing pad saturated with the polishing composition. Typical abrasive materials include silicon dioxide, cerium oxide, aluminum oxide, zirconium oxide, and tin oxide. Polishing compositions are typically used in conjunction with polishing pads (e.g., a polishing cloth or disk). Instead of, or in addition to, being suspended in the polishing composition, the abrasive material may be incorporated into the polishing pad.

As a method for isolating elements of a semiconductor device, a great deal of attention is being directed towards a shallow trench isolation (STI) process where a silicon nitride layer is formed on a silicon substrate, shallow trenches are formed via etching or photolithography, and a dielectric layer (e.g., an oxide) is deposited to fill the trenches. Due to variation in the depth of trenches, or lines, formed in this manner, it is typically necessary to deposit an excess of dielectric material on top of the substrate to ensure complete filling of all trenches. The excess dielectric material is then typically removed by a chemical-mechanical planarization process to expose the silicon nitride layer. When the silicon nitride layer is exposed, the largest area of the substrate exposed to the chemical-mechanical polishing composition comprises silicon nitride, which must then be polished to achieve a highly planar and uniform surface.

Generally, past practice has been to emphasize selectivity for oxide polishing in preference to silicon nitride polishing. Thus, the silicon nitride layer has served as a stopping layer during the chemical-mechanical planarization process, as the overall polishing rate decreased upon exposure of the silicon nitride layer.

Recently, selectivity for oxide polishing in preference to polysilicon polishing has also been emphasized. For example, the addition of a series of BRIJ™ and polyethylene oxide surfactants, as well as PLURONIC™ L-64, an ethylene oxide-propylene oxide-ethylene oxide triblock copolymer with an HLB of 15, is purported to increase the polishing selectivity of oxide to polysilicon (see Lee et al., "Effects of Nonionic Surfactants on Oxide-to-Polysilicon Selectivity during Chemical Mechanical Polishing," *J. Electrochem. Soc.*, 149(8): G477-G481 (2002)). Also, U.S. Pat. No. 6,626,968 discloses that polishing selectivity of silicon oxide to polysilicon can be improved through the use of a polymer additive having hydrophilic and hydrophobic functional groups selected from polyvinylmethylether, polyethylene glycol, polyoxyethylene 23 lauryl ether, polypropanoic acid, polyacrylic acid, and polyether glycol bis(ether).

The STI substrate is typically polished using a conventional polishing medium and an abrasive-containing polishing composition. However, polishing STI substrates with conventional polishing media and abrasive-containing polishing compositions has been observed to result in overpolishing of the substrate surface or the formation of recesses in the STI features and other topographical defects such as microscratches on the substrate surface. This phenomenon of overpolishing and forming recesses in the STI features is referred to as dishing. Dishing is undesirable because dishing of substrate features may detrimentally affect device fabrication by causing failure of isolation of transistors and transistor components from one another, thereby resulting in short-circuits. Additionally, overpolishing of the substrate may also result in oxide loss and exposure of the underlying oxide to damage from polishing or chemical activity, which detrimentally affects device quality and performance.

Thus, there remains a need in the art for polishing compositions and methods that can provide desirable selectivity of silicon oxide, silicon nitride, and polysilicon and that have suitable removal rates, low defectivity, and suitable dishing performance.

BRIEF SUMMARY OF THE INVENTION

The invention provides a chemical-mechanical polishing composition comprising, consisting essentially of, or consisting of (a) about 0.05 wt. % to about 10 wt. % of a ceria abrasive, (b) about 10 ppm to about 1000 ppm of a polymer of formula I:

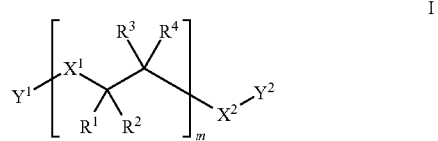

wherein $X^1$ and $X^2$ are independently selected from O, C, and S, $Y^1$ and $Y^2$ are independently selected from OH, $C_1$-$C_{10}$ alkyl, and a group of the formula $C_xH_yF_z$, $R^1$, $R^2$, $R^3$, and $R^4$ are independently selected from hydrogen, F, $C_1$-$C_{10}$ alkyl, $C_6$-$C_{10}$ aryl, and heteroaromatic, x is an integer of 1 to about 20, z is an integer of 1 to about 41, m is an integer of about 3 to about 500, and at least one of $Y^1$ or $Y^2$ is $C_xH_yF_z$ or at least one of $R^1$-$R^4$ is F, and (c) water, wherein the polishing composition has a pH of about 1 to about 4.5.

The invention also provides a method of chemically-mechanically polishing a substrate comprising (i) contacting a substrate with a polishing pad and a chemical-mechanical polishing composition comprising, consisting essentially of, or consisting of (a) about 0.05 wt. % to about 10 wt. % of a ceria abrasive, (b) about 10 ppm to about 1000 ppm of a polymer of formula I:

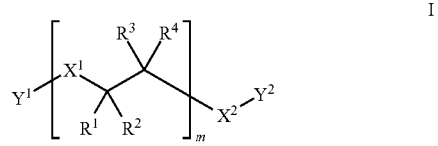

wherein $X^1$ and $X^2$ are independently selected from O, C, and S, $Y^1$ and $Y^2$ are independently selected from OH, $C_1$-$C_{10}$ alkyl, and a group of the formula $C_xH_yF_z$, $R^1$, $R^2$, $R^3$, and $R^4$ are independently selected from hydrogen, F, $C_1$-$C_{10}$ alkyl, $C_6$-$C_{10}$ aryl, and heteroaromatic, x is an integer of 1 to about 20, z is an integer of 1 to about 41, and m is an integer of about 3 to about 500, wherein at least one of $Y^1$ or $Y^2$ is $C_xH_yF_z$, or at least one of $R^1$-$R^4$ is F, and (c) water, wherein the polishing composition has a pH of about 1 to about 4.5, (ii) moving the polishing pad and the chemical-mechanical polishing composition relative to the substrate, and (iii) abrading at least a portion of the substrate to polish the substrate.

DETAILED DESCRIPTION OF THE INVENTION

The invention provides a chemical-mechanical polishing composition comprising, consisting essentially of, or consisting of (a) about 0.05 wt. % to about 10 wt. % of a ceria abrasive, (b) about 10 ppm to about 1000 ppm of a polymer of formula I:

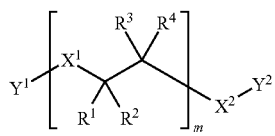

wherein $X^1$ and $X^2$ are independently selected from O, C, and S, $Y^1$ and $Y^2$ are independently selected from OH, $C_1$-$C_{10}$ alkyl, and a group of the formula $C_xH_yF_z$, $R^1$, $R^2$, $R^3$, and $R^4$ are independently selected from hydrogen, F, $C_1$-$C_{10}$ alkyl. $C_6$-$C_{10}$ aryl, and heteroaromatic, x is an integer of 1 to about 20, z is an integer of 1 to about 41, m is an integer of about 3 to about 500, and at least one of $Y^1$ or $Y^2$ is $C_xH_yF_z$ or at least one of $R^1$-$R^4$ is F, and (c) water, wherein the polishing composition has a pH of about 1 to about 4.5.

The chemical-mechanical polishing composition comprises a ceria abrasive. As known to one of ordinary skill in the art, ceria is an oxide of the rare earth metal cerium, and is also known as ceric oxide, cerium oxide (e.g., cerium(IV) oxide), or cerium dioxide. Cerium(IV) oxide (CeO) can be formed by calcining cerium oxalate or cerium hydroxide. Cerium also forms cerium(III) oxides such as, for example, $Ce_2O_3$. The ceria abrasive can be any one or more of these or other oxides of ceria.

The ceria abrasive can be of any suitable type. As used herein, "wet-process" ceria refers to a ceria prepared by a precipitation, condensation-polymerization, or similar process (as opposed to, for example, fumed or pyrogenic ceria). A polishing composition of the invention comprising a wet-process ceria abrasive has been typically found to exhibit lower defects when used to polish substrates according to a method of the invention. Without wishing to be bound to a particular theory, it is believed that wet-process ceria comprises spherical ceria particles and/or smaller aggregate ceria particles, thereby resulting in lower substrate defectivity when used in the inventive method. An illustrative wet-process ceria is HC-60™ ceria commercially available from Rhodia.

The ceria particles can have any suitable average size (i.e., average particle diameter). If the average ceria particle size is too small, the polishing composition may not exhibit sufficient removal rate. In contrast, if the average ceria particle size is too large, the polishing composition may exhibit undesirable polishing performance such as, for example, poor substrate defectivity. Accordingly, the ceria particles can have an average particle size of about 10 nm or more, for example, about 15 nm or more, about 20 nm or more, about 25 nm or more, about 30 nm or more, about 35 nm or more, about 40 nm or more, about 45 nm or more, or about 50 nm or more. Alternatively, or in addition, the ceria can have an average particle size of about 1,000 nm or less, for example, about 750 nm or less, about 500 nm or less, about 250 nm or less, about 150 nm or less, about 100 nm or less, about 75 nm or less, or about 50 nm or less. Thus, the ceria can have an average particle size bounded by any two of the aforementioned endpoints. For example, the ceria can have an average particle size of about 10 nm to about 1,000 nm, about 10 nm to about 750 nm, about 15 nm to about 500 nm, about 20 nm to about 250 nm, about 20 nm to about 150 nm, about 25 nm to about 150 nm, about 25 nm to about 100 nm, or about 50 nm to about 150 nm, or about 50 nm to about 100 nm. For non-spherical ceria particles, the size of the particle is the diameter of the smallest sphere that encompasses the particle. The particle size of the ceria can be measured using any suitable technique, for example, using laser diffraction techniques. Suitable particle size measurement instruments are available from e.g., Malvern Instruments (Malvern, UK).

The ceria particles preferably are colloidally stable in the inventive polishing composition. The term colloid refers to the suspension of ceria particles in the liquid carrier (e.g., water). Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $\{[B]-[T]\}/[C] \leq 0.5$). More preferably, the value of $[B]-[T]/[C]$ is less than or equal to 0.3, and most preferably is less than or equal to 0.1.

The polishing composition can comprise any suitable amount of ceria abrasive. If the polishing composition of the invention comprises too little ceria abrasive, the composition may not exhibit sufficient removal rate. In contrast, if the polishing composition comprises too much ceria abrasive then the polishing composition may exhibit undesirable polishing performance and/or may not be cost effective and/or may lack stability. The polishing composition can comprise about 10 wt. % or less of ceria, for example, about 9 wt. % or less, about 8 wt. % or less, about 7 wt. % or less, about 6 wt. % or less, about 5 wt. % or less, about 4 wt. % or less, about 3 wt. % or less, about 2 wt. % or less, about 1 wt. % or less, about 0.9 wt. % or less, about 0.8 wt. % or less, about 0.7 wt. % or less, about 0.6 wt. % or less of ceria, or about 0.5 wt. % or less of ceria. Alternatively, or in addition, the polishing composition can comprise about 0.05 wt. % or more, for example, about 0.1 wt. % or more, about 0.2 wt. % or more, about 0.3 wt. % or more, about 0.4 wt. % or more, about 0.5 wt. % or more, or about 1 wt. % or more of ceria. Thus, the polishing composition can comprise ceria in an amount bounded by any two of the aforementioned endpoints. For example, the polishing composition can comprise about 0.05 wt. % to about 10 wt. % of ceria, for example, 0.1 wt. % to about 10 wt. %, about 0.1 wt. % to about 9 wt. %, about 0.1 wt. % to about 8 wt. %, about 0.1 wt. % to about 7 wt. %, about 0.1 wt. % to about 6 wt. %, about 0.1 wt. % to about 5 wt. % of ceria, about 0.1 wt. % to about 4 wt. %, about 0.1 wt. % to about 3 wt. % of ceria, about 0.1 wt. % to about 2 wt. % of ceria, about 0.1 wt. % to about 1 wt. % of ceria, about 0.2 wt. % to about 2 wt. % of ceria, about 0.2 wt. % to about 1 wt. % of ceria, or about 0.3 wt. % to about 0.5 wt. % of ceria. In an embodiment, the polishing composition comprises, at point-of-use, about 0.2 wt. % to about 0.6 wt. % of ceria (e.g., about 0.4 wt. % of ceria). In another embodiment, the polishing composition comprises, as a concentrate, about 2.4 wt. % of ceria.

The chemical-mechanical polishing composition comprises a polymer of formula I as described herein.

In certain embodiments, the polymer is of formula I wherein at least one of $Y^1$ or $Y^2$ is $C_xH_yF_z$. In certain embodiments, the polymer is of formula I wherein both of $Y^1$ and $Y^2$ are $C_xH_yF_z$. In certain embodiments, x is an integer of 1 to 9. In certain embodiments, x in an integer of 1 to 8, and y is an integer of 1 to 40. As will be understood by one of ordinary skill in the art, in the group of the formula $C_xH_yF_z$, y+z=2x+1, such that specifying any two of x, y, and z allows for calculation of the third variable. In certain preferred embodiments, the polymer is of formula I wherein each of $X^1$ and $X^2$ is O. In certain embodiments, each of $R^1$, $R^2$, $R^3$, and $R^4$ is independently hydrogen or F. In certain of these embodiments, at least one of $R^1$, $R^2$, $R^3$, and $R^4$ is F, and $Y^1$ and $Y^2$ can be any of the groups described herein for $Y^1$ and $Y^2$. Non-limiting examples of suitable polymers of formula I include members of the CAPSTONE™ series of polymers supplied by DuPont, for example, CAPSTONE™ FS-30, CAPSTONE™ FS-31, CAPSTONE™ FS-34, CAPSTONE™ FS-35, CAPSTONE™ FS-65, CAPSTONE™ FS-81, and CAPSTONE™ ST-100HS.

The polymer of formula I can have any suitable molecular weight. The polymer of formula I can have an average molecular weight of about 500 g/mol or more, for example, about 600 g/mol or more, about 750 g/mol or more, about 1,000 g/mol or more, about 1,500 g/mol or more, about 2,000 g/mol or more, about 2,500 g/mol or more, about 3,000 g/mol or more, about 3,500 g/mol or more, about 4,000 g/mol or more, about 4,500 g/mol or more, about 5,000 g/mol or more, about 5,500 g/mol or more, about 6,000 g/mol or more, about 6,500 g/mol or more, about 7,000 g/mol or more, or about 7,500 g/mol or more. Alternatively, or in addition, the polymer of formula I can have an average molecular weight of about 10,000 g/mol or less, for example, about 9,000 g/mol or less, about 8,000 g/mol or less, about 7.500 g/mol or less, about 7,000 g/mol or less, about 6,500 g/mol or less, about 6,000 g/mol or less, about 5,500 g/mol or less, about 5.000 g/mol or less, about 4,500 g/mol or less, about 4.000 g/mol or less, about 3,500 g/mol or less, about 3,000 g/mol or less, about 2,500 g/mol or less, or about 2,000 g/mol or less. Thus, the polymer of formula I can have an average molecular weight bounded by any two of the aforementioned endpoints. For example, the polymer of formula I can have an average molecular weight of about 500 g/mol to about 10,000 g/mol, about 500 g/mol to about 9,000 g/mol, about 500 g/mol to about 8,000 g/mol, about 500 g/mol to about 7,000 g/mol, about 500 g/mol to about 6,000 g/mol, about 500 g/mol to about 5,000 g/mol, about 1000 g/mol to about 10,000 g/mol, about 1000 g/mol to about 9,000 g/mol, about 1000 g/mol to about 8,000 g/mol, about 1000 g/mol to about 7,000 g/mol, about 1000 g/mol to about 6,000 g/mol, or about 1000 g/mol to about 5,000 g/mol.

The polishing composition comprises any suitable amount of the polymer of formula I at the point-of-use. The polishing composition can comprise about 10 ppm or more, for example, about 15 ppm or more, about 20 ppm or more, about 25 ppm or more, about 30 ppm or more, about 35 ppm or more, or about 40 ppm or more, of the polymer of formula I. Alternatively, or in addition, the polishing composition can comprise about 1000 ppm or less, for example, about 800 ppm or less, about 600 ppm or less, about 400 ppm or less, about 200 ppm or less, about 100 ppm or less, about 80 ppm or less, about 60 ppm or less, or about 40 ppm or less, of the polymer of formula I. Thus, the polishing composition can comprise the polymer of formula I in an amount bounded by any two of the aforementioned endpoints. For example, the polishing composition can comprise about 10 ppm to about 1000 ppm, about 15 ppm to about 800 ppm, about 15 ppm to about 600 ppm, about 15 ppm to about 400 ppm, about 15 ppm to about 200 ppm, about 15 ppm to about 100 ppm, about 15 ppm to about 80 ppm, about 15 ppm to about 60 ppm, or about 15 ppm to about 40 ppm of the polymer of formula I.

The chemical-mechanical polishing composition optionally comprises an ionic polymer selected from (a) an ionic polymer of formula II:

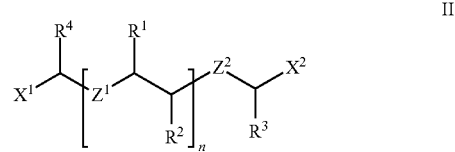

wherein $X^1$ and $X^2$ are independently selected from hydrogen, —OH, and —COOH, and at least one of $X^1$ and $X^2$ is —COOH, $Z^1$ and $Z^2$ are independently O or S, $R^1$, $R^2$, $R^3$, and $R^4$ are independently selected from hydrogen, $C_1$-$C_6$ alkyl, and $C_7$-$C_{10}$ aryl, and n is an integer of about 3 to about 500, and (b) a polyacrylate.

In certain embodiments, the ionic polymer is of formula II wherein $X^1$ and $X^2$ are both —COOH. In certain embodiments, the ionic polymer is of formula II wherein $Z^1$ and $Z^2$ are both 0, and $R^1$, $R^2$, $R^3$, and $R^4$ are hydrogen. In certain preferred embodiments, the ionic polymer is of formula II wherein $X^1$ and $X^2$ are both —COOH, $Z^1$ and $Z^2$ are both O, and $R^1$, $R^2$, $R^3$, and $R^4$ are hydrogen. A non-limiting example of a suitable ionic polymer of formula II is poly(ethylene glycol) dicarboxylic acid with an average molecular weight of 600 g/mol (PDA600) available from Sigma Aldrich.

In certain embodiments, the ionic polymer is a polyacrylate. The polyacrylate can be an unmodified polyacrylate. In certain embodiments, the polyacrylate is a hydrophobically-modified polyacrylate. A non-limiting example of a suitable polyacrylate is Mighty 21ES available from Kao Corporation.

The ionic polymer can have any suitable molecular weight. The ionic polymer can have an average molecular weight of about 250 g/mol or more, for example, about 300 g/mol or more, about 400 g/mol or more, about 500 g/mol or more, about 600 g/mol or more, about 750 g/mol or more, about 1,000 g/mol or more, about 1,500 g/mol or more, about 2,000 g/mol or more, about 2,500 g/mol or more, about 3,000 g/mol or more, about 3,500 g/mol or more, about 4,000 g/mol or more, about 4.500 g/mol or more, about 5,000 g/mol or more, about 5,500 g/mol or more, about 6,000 g/mol or more, about 6,500 g/mol or more, about 7,000 g/mol or more, or about 7,500 g/mol or more. Alternatively, or in addition, the ionic polymer can have an average molecular weight of about 15,000 g/mol or less, for example, about 14,000 g/mol or less, about 13,000 g/mol or less, about 12,000 g/mol or less, about 11,000 g/mol or less, about 10,000 g/mol or less, about 9,000 g/mol or less, about 8,000 g/mol or less, about 7,500 g/mol or less, about 7,000 g/mol or less, about 6,500 g/mol or less, about 6,000 g/mol or less, about 5,500 g/mol or less, about 5,000 g/mol or less, about 4,500 g/mol or less, about 4,000 g/mol or less, about 3,500 g/mol or less, about 3,000 g/mol or less, about 2,500 g/mol or less, or about 2,000 g/mol or less. Thus, the ionic polymer can have an average molecular weight bounded by any two of the aforementioned endpoints. For example, the ionic polymer can have an average molecular weight of about 250 g/mol to about 15,000 g/mol, about 250 g/mol to about 14,000 g/mol, about 250 g/mol to about 13,000 g/mol, about 250 g/mol to about 12,000 g/mol, about 250 g/mol to about 11,000 g/mol, about 250 g/mol to about 10,000 g/mol, about 400 g/mol to about 10,000 g/mol, about 400 g/mol to about 8,000 g/mol, about 400 g/mol to about 6,000 g/mol, about 400 g/mol to about 4,000 g/mol, about 400 g/mol to about 2,000 g/mol, and the like.

The polishing composition comprises any suitable amount of the ionic polymer at the point-of-use. The polishing composition can comprise about 0.001 wt. % or more, for example, about 0.005 wt. % or more, about 0.01 wt. % or more, about 0.025 wt. % or more, about 0.05 wt. % or more, about 0.075 wt. % or more, or about 0.1 wt. % or more, of the ionic polymer. Alternatively, or in addition, the polishing composition can comprise about 1 wt. % or less, for example, about 0.9 wt. % or less, about 0.8 wt. % or less, about 0.7 wt. % or less, about 0.6 wt. % or less, about 0.5 wt. % or less, about 0.4 wt. % or less, or about 0.3 wt. % or less, of the ionic polymer. Thus, the polishing composition can comprise the ionic polymer in an amount bounded by any two of the aforementioned endpoints. For example, the polishing composition can comprise about 0.001 wt. % to about 1 wt. %, about 0.01 wt. % to about 0.9 wt. %, about 0.025 wt. % to about 0.8 wt. %, about 0.05 wt. % to about 0.7 wt. %, or about 0.1 wt. % to about 0.5 wt. % of the ionic polymer, and the like.

The chemical-mechanical polishing composition optionally comprises one or more polyvinyl alcohols. The polyvinyl alcohol can be any suitable polyvinyl alcohol and can be a linear or branched polyvinyl alcohol. Non-limiting examples of suitable branched polyvinyl alcohols are the Nichigo G-polymers, such as the OKS-1009 and OKS-1083 products, available from Nippon Gohsei, Japan.

The polyvinyl alcohol can have any suitable degree of hydrolysis. The degree of hydrolysis refers to the amount of free hydroxyl groups present on the polyvinyl alcohol as compared with the sum of free hydroxyl groups and acetylated hydroxyl groups. Preferably, the polyvinyl alcohol has a degree of hydrolysis of about 90% or more, e.g., about 92% or more, about 94% or more, about 96% or more, about 98% or more, or about 99% or more.

The polyvinyl alcohol can have any suitable molecular weight. The polyvinyl alcohol can have an average molecular weight of about 250 g/mol or more, for example, about 300 g/mol or more, about 400 g/mol or more, about 500 g/mol or more, about 600 g/mol or more, about 750 g/mol or more, about 1,000 g/mol or more, about 2,000 g/mol or more, about 3,000 g/mol or more, about 4,000 g/mol or more, about 5,000 g/mol or more, about 7,500 g/mol or more, about 10,000 g/mol or more, about 15,000 g/mol or more, about 20,000 g/mol or more, about 25,000 g/mol or more, about 30,000 g/mol or more, about 50,000 g/mol or more, or about 75,000 g/mol or more. Alternatively, or in addition, the polyvinyl alcohol can have an average molecular weight of about 250,000 g/mol or less, for example, about 200,000 g/mol or less, about 180,000 g/mol or less, about 150,000 g/mol or less, about 100,000 g/mol or less, about 90,000 g/mol or less, about 85,000 g/mol or less, about 80,000 g/mol or less, about 75,000 g/mol or less, about 50,000 g/mol or less, about 45,000 g/mol or less, about 40,000 g/mol or less, about 35,000 g/mol or less, about 30,000 g/mol or less, about 25,000 g/mol or less, about 20,000 g/mol or less, about 15,000 g/mol or less, about 12.500 g/mol or less, or about 10,000 g/mol or less. Thus, the polyvinyl alcohol can have an average molecular weight bounded by any two of the aforementioned endpoints. For example, the polyvinyl alcohol can have an average molecular weight of about 250 g/mol to about 250,000 g/mol, 250 g/mol to about 200,000 g/mol, 250 g/mol to about 180,000 g/mol, 250 g/mol to about 150,000 g/mol, 250 g/mol to about 100,000 g/mol, about 250 g/mol to about 75,000 g/mol, about 250 g/mol to about 50,000 g/mol, about 250 g/mol to about 25,000 g/mol, about 250 g/mol to about 10,000 g/mol, about 10,000 g/mol to about 100,000 g/mol, about 10,000 g/mol to about 75,000 g/mol, about 10,000 g/mol to about 50,000 g/mol, about 10,000 g/mol to about 40,000 g/mol, about 50,000 g/mol to about 100,000 g/mol, about 75,000 g/mol to about 100,000 g/mol, about 25,000 g/mol to about 200,000 g/mol, or about 50,000 g/mol to about 180,000 g/mol, and the like.

The polishing composition comprises any suitable amount of polyvinyl alcohol at the point-of-use. The polishing composition can comprise about 0.001 wt. % or more, for example, about 0.005 wt. % or more, about 0.01 wt. % or more, about 0.025 wt. % or more, about 0.05 wt. % or more, about 0.075 wt. % or more, or about 0.1 wt. % or more, of the polyvinyl alcohol. Alternatively, or in addition, the polishing composition can comprise about 1 wt. % or less, for example, about 0.9 wt. % or less, about 0.8 wt. % or less, about 0.7 wt. % or less, about 0.6 wt. % or less, about 0.5 wt. % or less, about 0.4 wt. % or less, or about 0.3 wt. % or less, of the polyvinyl alcohol. Thus, the polishing composition can comprise the ionic polymer in an amount bounded by any two of the aforementioned endpoints. For example, the polishing composition can comprise about 0.001 wt. % to about 1 wt. %, about 0.01 wt. % to about 0.9 wt. %, about 0.025 wt. % to about 0.8 wt. %, about 0.05 wt. % to about 0.7 wt. %, or about 0.1 wt. % to about 0.5 wt. % of the polyvinyl alcohol, and the like.

The chemical-mechanical polishing composition optionally comprises one or more nonionic polymers that are different from the polyvinyl alcohol. In accordance with an embodiment of the invention, the polishing composition comprises one or more nonionic polymers selected from the group consisting of polyalkylene glycols, polyetheramines, polyethylene oxide/polypropylene oxide copolymers, polyacrylamide, polyvinylpyrrolidone, siloxane polyalkyleneoxide copolymers, hydrophobically modified polyacrylate copolymers, hydrophilic nonionic polymers, polysaccharides, and mixtures thereof. The nonionic polymers are preferably water-soluble and compatible with other components of the polishing composition. In some embodiments, the nonionic polymer functions as a surfactant and/or wetting agent.

The chemical-mechanical polishing composition can comprise one or more compounds capable of adjusting (i.e., that adjust) the pH of the polishing composition (i.e., pH adjusting compounds). The pH of the polishing composition can be adjusted using any suitable compound capable of adjusting the pH of the polishing composition. The pH adjusting compound desirably is water-soluble and compatible with the other components of the polishing composition. Typically, the chemical-mechanical polishing composition has a pH of about 1 to about 7 at the point-of-use. Preferably, the chemical-mechanical polishing composition has a pH of about 1 to about 4.5 at the point-of-use.

The inventive polishing composition can be formulated to provide buffering capability. Typically, buffering of the polishing composition can be accomplished by addition of a basic compound or compounds to adjust the pH value of the polishing composition to a value in the range of the pKa value or pKa values of the ionic polymer of formula II. Any suitable basic compound may be used to adjust the pH value to provide for buffering capability. Non-limiting examples of suitable basic compounds include sodium hydroxide, potassium hydroxide, ammonium hydroxide, and organic amines such as triethanolamine. Ionic polymers of formula II are acidic in nature. Thus, when the polishing composition comprises an ionic polymer of formula II, the presence of a basic compound provides buffering capability to the polishing composition.

In other embodiments, it is desirable that the polishing composition comprise another compound capable of adjusting the pH and which is separately capable of buffering an acidic pH of the polishing composition. Accordingly, in these embodiments, it is desirable that the pH of the polishing composition is less than 7.0 (e.g., 6.5+/−0.5, 6.0+/−0.5, 5.5+/−0.5, 5.0+/−0.5, 4.5+/−0.5, 4.0+/−0.5, 3.5+/−0.5, 3.0+/−0.5, 2.5+/−0.5, 2.0+/−0.5, 1.5+/−0.5, or 1.0+/−0.5). Typically, the pH of the polishing composition in these embodiments is about 1 to about 4.5 at the point-of-use. Thus, the compound capable of adjusting the pH of the polishing composition typically has at least one ionizable group having a pKa of about 3 to about 7 when measured at 25° C.

The compound capable of adjusting and buffering the pH can be selected from the group consisting of ammonium salts, alkali metal salts, carboxylic acids, alkali metal hydroxides, alkali metal carbonates, alkali metal bicarbonates, borates, and mixtures thereof.

The chemical-mechanical polishing composition optionally further comprises one or more additives. Illustrative additives include conditioners, acids (e.g., sulfonic acids), complexing agents (e.g., anionic polymeric complexing agents), chelating agents, biocides, scale inhibitors, dispersants, etc.

A biocide, when present, can be any suitable biocide and can be present in the polishing composition in any suitable amount. A suitable biocide is an isothiazolinone biocide. The amount of biocide used in the polishing composition typically is about 1 to about 50 ppm, preferably about 10 to about 20 ppm.

It will be understood that any of the components of the polishing composition that are acids, bases, or salts (e.g., ionic polymer, base, ammonium hydroxide, etc.), when dissolved in the water of the polishing composition, can exist in dissociated form as cations and anions. The amounts of such compounds present in the polishing composition as recited herein will be understood to refer to the weight of the undissociated compound used in the preparation of the polishing composition.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., ceria abrasive, polymer of formula I, optional ionic polymer, optional polyvinyl alcohol, optional nonionic polymer, optional pH adjustor, and/or any optional additive) as well as any combination of ingredients (e.g., ceria abrasive, polymer of formula II, optional ionic polymer, optional polyvinyl alcohol, optional nonionic polymer, etc.).

For example, the polishing composition can be prepared by (i) providing all or a portion of the liquid carrier, (ii) dispersing the ceria abrasive, polymer of formula I, optional ionic polymer, optional polyvinyl alcohol, optional nonionic polymer, optional pH adjustor, and/or any optional additive, using any suitable means for preparing such a dispersion, (iii) adjusting the pH of the dispersion as appropriate, and (iv) optionally adding suitable amounts of any other optional components and/or additives to the mixture.

Alternatively, the polishing composition can be prepared by (i) providing one or more components (e.g., liquid carrier, optional polyvinyl alcohol, optional nonionic polymer, optional pH adjustor, and/or any optional additive) in a cerium oxide slurry, (ii) providing one or more components in an additive solution (e.g., liquid carrier, polymer of formula I, optional ionic polymer, optional polyvinyl alcohol, optional nonionic polymer, optional pH adjustor, and/or any optional additive), (iii) combining the cerium oxide slurry and the additive solution to form a mixture, (iv) optionally adding suitable amounts of any other optional additives to the mixture, and (v) adjusting the pH of the mixture as appropriate.

The polishing composition can be supplied as a one-package system comprising a ceria abrasive, polymer of formula I, optional ionic polymer, optional polyvinyl alcohol, optional nonionic polymer, optional pH adjustor, and/or any optional additive, and water. Alternatively, the polishing composition of the invention is supplied as a two-package system comprising a cerium oxide slurry in a first package and an additive solution in a second package, wherein the ceria oxide slurry consists essentially of, or consists of, a ceria abrasive, optional polyvinyl alcohol, optional nonionic polymer, optional pH adjustor, and/or any optional additive, and water, and wherein the additive solution consists essentially of, or consists of, polymer of formula I, optional ionic polymer, optional polyvinyl alcohol, optional nonionic polymer, optional pH adjustor, and/or any optional additive. The two-package system allows for the adjustment of substrate global flattening characteristics and polishing speed by changing the blending ratio of the two packages, i.e., the cerium oxide slurry and the additive solution.

Various methods can be employed to utilize such a two-package polishing system. For example, the cerium oxide slurry and additive solution can be delivered to the polishing table by different pipes that are joined and connected at the outlet of supply piping. The cerium oxide slurry and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

Similarly, a three-, four-, or more package system can be utilized in connection with the invention, wherein each of multiple containers contains different components of the inventive chemical-mechanical polishing composition, one or more optional components, and/or one or more of the same components in different concentrations.

In order to mix components contained in two or more storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). By the term "flow line" is meant a path of flow from an individual storage container to the point-of-use of the component stored therein. The flow lines can each lead directly to the point-of-use, or two or more of the flow lines can be combined at any point into a single flow line that leads to the point-of-use. Furthermore, any of the flow lines (e.g., the individual flow lines or a combined flow line) can first lead to one or more other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if the components are combined about 5 minutes or less prior to being added in mixed form onto the platen, for example, about 4 minutes or less, about 3 minutes or less, about 2 minutes or less, about 1 minute or less, about 45 s or less, about 30 s or less, about 10 s or less prior to being added in mixed form onto the platen, or simultaneously to the delivery of the components at the point-of-use (e.g., the components are combined at a dispenser). Components also are combined "immediately before delivery to the point-of-use" if the components are combined within 5 m of the point-of-use, such as within 1 m of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the ceria abrasive, polymer of formula I, optional ionic polymer, optional polyvinyl alcohol, optional nonionic polymer, optional pH adjustor, and/or any optional additive can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, or 4 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the ceria abrasive, polymer of formula I, optional ionic polymer, optional polyvinyl alcohol, optional nonionic polymer, optional pH adjustor, and/or any optional additive are at least partially or fully dissolved in the concentrate.

The invention also provides a method of chemically-mechanically polishing a substrate comprising (i) contacting a substrate with a polishing pad and the chemical-mechanical polishing composition as described herein, (ii) moving the polishing pad relative to the substrate with the chemical-mechanical polishing composition therebetween, and (iii) abrading at least a portion of the substrate to polish the substrate.

The chemical-mechanical polishing composition can be used to polish any suitable substrate and is especially useful for polishing substrates comprising at least one layer (typically a surface layer) comprised of a low dielectric material. Suitable substrates include wafers used in the semiconductor industry. The wafers typically comprise or consist of, for example, a metal, metal oxide, metal nitride, metal composite, metal alloy, a low dielectric material, or combinations thereof. The method of the invention is particularly useful for polishing substrates comprising silicon oxide, silicon nitride, and/or polysilicon, e.g., any one, two, or especially all three of the aforementioned materials.

In certain embodiments, the substrate comprises polysilicon in combination with silicon oxide and/or silicon nitride. The polysilicon can be any suitable polysilicon, many of which are known in the art. The polysilicon can have any suitable phase, and can be amorphous, crystalline, or a combination thereof. The silicon oxide similarly can be any suitable silicon oxide, many of which are known in the art. Suitable types of silicon oxide include but are not limited to borophosphosilicate glass (BPSG), PETEOS, thermal oxide, undoped silicate glass, and HDP oxide.

The chemical-mechanical polishing composition of the invention desirably exhibits a high removal rate when polishing a substrate comprising silicon oxide according to a method of the invention. For example, when polishing silicon wafers comprising high density plasma (HDP) oxides and/or plasma-enhanced tetraethyl ortho silicate (PETEOS) and/or tetraethyl orthosilicate (TEOS) in accordance with an embodiment of the invention, the polishing composition desirably exhibits a silicon oxide removal rate of about 500 Å/min or higher, for example, 700 Å/min or higher, about 1,000 Å/min or higher, about 1,250 Å/min or higher, about 1,500 Å/min or higher, about 1,750 Å/min or higher, about 2,000 Å/min or higher, about 2,500 Å/min or higher, about 3,000 Å/min or higher, or about 3,500 Å/min or higher. In an embodiment, removal rate for silicon oxide can be about 4,000 Å/min or higher, about 4,500 Å/min or higher, or about 5,000 Å/min or higher.

The chemical-mechanical polishing composition of the invention desirably exhibits a low removal rate when polishing a substrate comprising silicon nitride according to a method of the invention. For example, when polishing silicon wafers comprising silicon nitride in accordance with an embodiment of the invention, the polishing composition desirably exhibits a removal rate of the silicon nitride of about 250 Å/min or lower, for example, about 200 Å/min or lower, about 150 Å/min or lower, about 100 Å/min or lower, about 75 Å/min or lower, about 50 Å/min or lower, or even about 25 Å/min or lower.

The chemical-mechanical polishing composition of the invention desirably exhibits a low removal rate when polishing a substrate comprising polysilicon according to a method of the invention. For example, when polishing silicon wafers comprising polysilicon in accordance with an embodiment of the invention, the polishing composition desirably exhibits a removal rate of polysilicon of about 1,000 Å/min or lower, for example, about 750 Å/min or lower, about 500 Å/min or lower, about 250 Å/min or lower, about 100 Å/min or lower, about 50 Å/min or lower, about 25 Å/min or lower, about 10 Å/min or lower, or even about 5 Å/min or lower.

The polishing composition of the invention desirably exhibits low particle defects when polishing a substrate, as determined by suitable techniques. In a preferred embodiment, the chemical-mechanical polishing composition of the invention comprises a wet-process ceria which contributes to the low defectivity. Particle defects on a substrate polished with the inventive polishing composition can be determined by any suitable technique. For example, laser light scattering techniques, such as dark field normal beam composite (DCN) and dark field oblique beam composite (DCO), can be used to determine particle defects on polished substrates. Suitable instrumentation for evaluating particle defectivity is available from, for example, KLA-Tencor (e.g., SURFSCAN™ SPI instruments operating at a 120 nm threshold or at 160 nm threshold).

A substrate, especially silicon comprising silicon oxide and/or silicon nitride and/or polysilicon, polished with the inventive polishing composition desirably has a DCN value of about 20,000 counts or less, for example, about 17,500 counts or less, about 15,000 counts or less, about 12,500 counts or less, about 3,500 counts or less, about 3.000 counts or less, about 2,500 counts or less, about 2,000 counts or less, about 1.500 counts or less, or about 1,000 counts or less. Preferably substrates polished in accordance with an embodiment of the invention has a DCN value of about 750 counts or less, for example, about 500 counts, about 250 counts, about 125 counts, or even about 100 counts or less. Alternatively, or in addition, a substrate polishing with the chemical-mechanical polishing composition of the invention desirably exhibits low scratches as determined by suitable techniques. For example, silicon wafers polished in accordance with an embodiment of the invention desirably have about 250 scratches or less, or about 125 scratches or less, as determined by any suitable method known in the art.

The chemical-mechanical polishing composition of the invention can be tailored to provide effective polishing at the desired polishing ranges selective to specific thin layer materials, while at the same time minimizing surface imperfections, defects, corrosion, erosion and the removal of stop layers. The selectivity can be controlled, to some extent, by altering the relative concentrations of the components of the polishing composition. When desirable, the chemical-mechanical polishing composition of the invention can be used to polish a substrate with a silicon dioxide to polysilicon polishing selectivity of about 5:1 or higher (e.g., about 10:1 or higher, about 15:1 or higher, about 25:1 or higher, about 50:1 or higher, about 100:1 or higher, or about 150:1 or even higher). Also, the chemical-mechanical polishing composition of the invention can be used to polish a substrate with a silicon nitride to polysilicon polishing selectivity of about 2:1 or higher (e.g., about 4:1 or higher, or about 6:1 or higher). Certain formulations can exhibit even higher silicon dioxide to polysilicon selectivities, such as about 20:1 or higher, or even about 30:1 or higher. In a preferred embodiment, the chemical-mechanical polishing composition of the invention simultaneously provides selective polishing of silicon dioxide relative to silicon nitride and selective polishing of silicon dioxide relative to polysilicon.

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to SURFIN™ 000, SURFIN™ SSW1, SPM3100 (commercially available from, for example, Eminess Technologies), POLITEX™, and Fujibo POLYPAS™ 27. A particularly preferred polishing pad is the EPIC™ D100 pad commercially available from Cabot Microelectronics. Another preferred polishing pad is the IC1010 pad available from Dow, Inc.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. No. 5,196,353, U.S. Pat. No. 5,433,651, U.S. Pat. No. 5,609,511. U.S. Pat. No. 5,643, 046, U.S. Pat. No. 5,658,183, U.S. Pat. No. 5,730,642, U.S. Pat. No. 5,838,447, U.S. Pat. No. 5,872,633. U.S. Pat. No. 5,893,796, U.S. Pat. No. 5,949,927, and U.S. Pat. No. 5,964, 643. Desirably, the inspection or monitoring of the progress of the polishing process with respect to a substrate being polished enables the determination of the polishing endpoint, i.e., the determination of when to terminate the polishing process with respect to a particular substrate.

EXAMPLES

These following examples further illustrate the invention but, of course, should not be construed as in any way limiting its scope.

The following abbreviations are used throughout the Examples: removal rate (RR); tetraethyl orthosilicate (TEOS); silicon nitride (SiN); polysilicon (polySi); molecular weight (MW); and polyethylene glycol (PEG).

In the following examples, substrates, TEOS silicon oxide (prepared from tetraethoxysilane) coated on silicon, HDP (high density plasma) silicon oxide coated on silicon, polysilicon coated on silicon, silicon nitride coated on silicon, and patterned wafers obtained from Silyb Inc. were polished using either a MIRRA™ (Applied Materials, Inc.) or a REFLEXION™ (Applied Materials, Inc.) tool. The patterned wafers comprised 100 μm silicon nitride features on silicon oxide-coated substrates. An IC 1010™ polishing pad (Rohm and Haas Electronic Materials) was used with identical polishing parameters for all compositions. Standard Mirra polishing parameters are as follows: IC1010™ pad, downforce=20.68 kPa (3 psi), headspeed=85 rpm, platen speed=100 rpm, total flow rate=150 mL/min. Removal rates were calculated by measuring the film thickness, using spectroscopic elipsometry, and subtracting the final thickness from the initial thickness.

anionic polymer Mighty 21ES (i.e., an ionic polymer which is a polyacrylate) was obtained from Kao. Polyvinyl alcohol ("PVA") was the OKS 1009 product from Nippon Gohsei. Kordek was a biocide obtained from Dow Chemical. TEA is triethanolamine.

TABLE 1

Wet-Process Ceria Formulations

| Formulation | Wet-process ceria (wt. %) | pH | PEG (wt. %) | Picolinic acid (wt. %) |
|---|---|---|---|---|
| WPC1 | 0.8 | 4 | 0.2 | 0.02 |
| WPC2 | 0.8 | 4 | 0.2 | 0.06 |

TABLE 2

Additive Formulations

| Formulation | Polymer of Formula 1 (ppm)* | Ionic Polymer (wt. %) | Additional Components Component 1 (wt. %) | Additional Components Component 2 (ppm) | Base | pH |
|---|---|---|---|---|---|---|
| F1 | — | PDA600 (0.2) | PVA (0.2) | Kordek (33) | NH$_4$OH | 3.5 |
| F2 | FS-30 (25) | PDA600 (0.2) | PVA (0.2) | Kordek (33) | NH$_4$OH | 3.5 |
| F3 | FS-31 (40) | PDA600 (0.2) | PVA (0.2) | Kordek (33) | NH$_4$OH | 3.5 |
| F4 | FS-34 (40) | PDA600 (0.2) | PVA (0.2) | Kordek (33) | NH$_4$OH | 3.5 |
| F5 | FS-35 (25) | PDA600 (0.2) | PVA (0.2) | Kordek (33) | NH$_4$OH | 3.5 |
| F6 | FS-65 (25) | PDA600 (0.2) | PVA (0.2) | Kordek (33) | NH$_4$OH | 3.5 |
| F7 | FS-81 (25) | PDA600 (0.2) | PVA (0.2) | Kordek (33) | NH$_4$OH | 3.5 |
| F8 | ST-100HS (25) | PDA600 (0.2) | PVA (0.2) | Kordek (33) | NH$_4$OH | 3.5 |
| F9 | — | Mighty 21ES (0.3) | PA (0.1) | Kordek (33) | TEA | 7 |
| F10 | FS-30 (25) | Mighty 21ES (0.3) | PA (0.1) | Kordek (33) | TEA | 7 |
| F11 | FS-65 (20) | Mighty 21ES (0.3) | PA (0.1) | Kordek (33) | TEA | 7 |
| F12 | FS-81 (25) | Mighty 21ES (0.3) | PA (0.1) | Kordek (33) | TEA | 7 |

*Identifies particular CAPSTONE ™ polymer

In the Examples described herein, polishing compositions were prepared by combining equal volumes of a wet-process ceria formulation and an additive formulation. In some cases, as noted below, the polishing compositions were further diluted with water to provide the specified amount of ceria in the polishing composition. The wet-process ceria was the HC-60™ product from Rhodia.

The wet-process ceria formulations and the additive formulations are set forth in Tables 1 and 2, respectively. PEG refers to a polyethylene glycol having a molecular weight of 8000 and obtained from Dow Corporation. The polymers of formula I were various CAPSTONE™ polymers obtained from DuPont and are identified in Table 2 for each polishing composition. Anionic polymer PDA600 (i.e., an ionic polymer of formula II) was a polyethylene glycol diacid having a molecular weight of 600 obtained from Sigma-Aldrich. The Example 1

Silicon wafers comprising TEOS and polysilicon were polished under identical conditions with Polishing Compositions 1A-1M. The polishing compositions were obtained by combining equal volumes of the abrasive formulations and additive formulations described in Tables 1 and 2 in the combinations set forth in Table 3. The pH of each of Polishing Compositions 1A-1M was adjusted to 4. Each of Polishing Compositions 1A-1M contained 0.4 wt. % wet-process ceria.

Following polishing, the removal rate for TEOS and polysilicon was determined, and the selectivity for TEOS vs. polysilicon was calculated. The results are set forth in Table 3.

TABLE 3

| Polishing Composition | Additive Formulation | Abrasive Formulation | Type | Oxide RR (Å/min) | Polysilicon RR (Å/min) | Selectivity |
|---|---|---|---|---|---|---|
| 1A | F1 | WPC1 | Comparative | 2264 | 70 | 31 |
| 1B | F1 | WPC2 | Comparative | 2312 | 32 | 72 |
| 1C | F2 | WPC1 | Invention | 2296 | 19 | 121 |
| 1D | F3 | WPC2 | Invention | 2282 | 17 | 134 |
| 1E | F4 | WPC1 | Invention | 2417 | 23 | 105 |
| 1F | F5 | WPC1 | Invention | 2282 | 17 | 134 |
| 1G | F6 | WPC1 | Invention | 2238 | 19 | 118 |
| 1H | F7 | WPC1 | Invention | 2355 | 13 | 181 |
| 1I | F8 | WPC1 | Invention | 1881 | 40 | 47 |
| 1J | F9 | WPC1 | Comparative | 1460 | 15 | 97 |
| 1K | F10 | WPC1 | Invention | 1373 | 4 | 343 |
| 1L | F11 | WPC1 | Invention | 1366 | 23 | 59 |
| 1M | F12 | WPC1 | Invention | 1004 | 2 | 502 |

As is apparent from the results set forth in Table 3, Polishing Compositions 1C-1H, 1K, and 1M (invention), which contained a polymer of Formula I, exhibited TEOS:polysilicon selectivities of approximately 105 to 502. Polishing Composition II exhibited a TEOS:polysilicon selectivity of approximately 47, but exhibited a TEOS removal rate of approximately 1881 Å/min. Polishing Compositions 1A, 1B, and 1J (comparative) exhibited TEOS:polysilicon selectivities of approximately 32 to 97. Polishing Composition 1 J (comparative) exhibited a TEOS:polysilicon selectivity of approximately 97, but exhibited a TEOS removal rate of approximately 1460 Å/min. The result for Polishing Composition 1L appeared to be an outlier.

Example 2

This example demonstrates the reduced variability in polysilicon removal rates exhibited by the inventive polishing composition in accordance with an embodiment of the invention.

Separate substrates comprising high density plasma ("HDP") oxide-coated silicon, TEOS-coated silicon, silicon nitride-coated silicon, and polysilicon-coated silicon were polished with four different polishing compositions, i.e., Polishing Compositions 2A-2D. Polishing Composition 2A (invention) comprised equal volumes of wet-process ceria formulation WPC1 diluted 1:1.7 with water and additive formulation F3 diluted to 1:1.5 with water to provide 0.23 wt. % of wet-process ceria. Polishing Composition 2B (invention) comprised equal volumes of wet-process ceria formulation WPC1 and additive formulation F3 to provide 0.4 wt. % of wet-process ceria. Polishing Composition 2C (comparative) comprised equal volumes of wet-process ceria formulation WPC1 diluted 1:1.7 with water and additive formulation F1 diluted to 1:1.5 with water to provide 0.23 wt. % of wet-process ceria. Polishing Composition 2D (comparative) comprised equal volumes of wet-process ceria formulation WPC1 and additive formulation F1 to provide 0.4 wt. % of wet-process ceria. Each of Polishing Compositions 2A-2D was adjusted to a pH of 4.

Following polishing, the removal rates for HDP, TEOS, silicon nitride, and polysilicon were determined. Each of Polishing Compositions 2C and 2D was evaluated twice. The results are set forth in Table 4.

TABLE 4

| Polishing Composition | Abrasive Content (wt. %) | HDP RR (Å/min) | TEOS RR (Å/min) | Silicon Nitride RR (Å/min) | Polysilicon RR (Å/min) |
|---|---|---|---|---|---|
| 2A (invention) | 0.23 | 1909 | 2351 | 7 | 16 |
| 2B (invention) | 0.4 | 2312 | 2420 | 9 | 17 |
| 2C (comparative) | 0.23 | 1810 | 2135 | 6 | 11 |
| 2C (comparative) | 0.23 | 1898 | 2115 | 9 | 40 |
| 2D (comparative) | 0.4 | 1960 | 2250 | 9 | 58 |
| 2D (comparative) | 0.4 | 2282 | 2438 | 7 | 32 |

As is apparent from the results set forth in Table 4, Polishing Compositions 2A and 2B (invention), which contained 0.23 wt. % and 0.4 wt. % wet-process ceria, respectively, and 13 ppm and 20 ppm of CAPSTONE™ FS-31, respectively, exhibited approximately the same polysilicon removal rates. Polishing Composition 2C (comparative), which contained 0.23 wt. % wet-process ceria and no CAPSTONE™ FS-31, and Polishing Composition 2D (comparative), which contained 0.4 wt. % wet-process ceria and no CAPSTONE™ FS-31, exhibited highly variable polysilicon removal rates.

Example 3

This example demonstrates the effect on dishing and erosion and on polysilicon loss and oxide loss observed with a polishing composition comprising wet-process ceria and a polymer of Formula I in accordance with an embodiment of the invention.

Separate patterned substrates comprising 100 μm and 900 μm polysilicon features (approximately 2200 Å thick features) initially coated with approximately 1300 Å of oxide on silicon oxide-coated substrates having an oxide trench depth of approximately 3200 Å were polished with three different polishing compositions, Polishing Compositions 3A-3C. Polishing Composition 3A (comparative) comprised a mixture of equal volumes of wet-process ceria formulation WPC1 and additive formulation F9. Polishing Composition 3B (comparative) comprised a mixture of equal volumes of wet-process ceria formulation WPC1 and additive formulation F1. Polishing Composition 3C (invention) comprised a mixture of equal volumes of wet-process ceria formulation WPC1 and additive formulation F3. Additive formulations F1 and F9 did not contain a polymer of formula I.

The substrates were polished to endpoint plus 40% overpolishing. Following polishing, the polysilicon loss in 100 μm features (expressed as delta polysilicon), the remaining trench oxide in 100 μm and 900 μm features, the erosion, and dishing were determined. The results are set forth in Table 5. The polishing time to endpoint and the overpolishing time are also indicated in Table 5.

TABLE 5

|  | Polishing Composition 3A (comparative) | Polishing Composition 3B (comparative) | Polishing Composition 3C (invention) |
| --- | --- | --- | --- |
| Endpoint + Overpolishing Time (s) | 71 + 28 | 31 + 12 | 29 + 11 |
| Delta Polysilicon | 2 | 1 | 1 |
| Remaining Trench Oxide (Å) (100 × 100 μm) | 1586 | 1897 | 1963 |
| Remaining Trench Oxide (Å) (900 × 900 μm) | 722 | 1697 | 1817 |
| Erosion (Å) | 45 | 25 | 18 |
| Dishing (Å) | 359 | 44 | 16 |

As is apparent from the results set forth in Table 5, Polishing Composition 3C (invention), which comprised 20 ppm of CAPSTONE™ FS-31, exhibited improved trench oxide protection on both 100 μm and 900 μm features. Relative to the inventive formulation 3C, the comparative examples 3A and 3B respectively show 81% and 97% of the trench protection shown by the inventive formulation 3C for the 100 μm feature. For the 900 μm feature, the comparative examples 3A and 3B respectively show 40% and 93% of the trench protection shown by the inventive formulation 3C. Polishing Composition 3C (invention) exhibited approximately 5% and 36% of the dishing and approximately 40% and 72% of the erosion exhibited by Polishing Compositions 3A and 3B (comparative), respectively.

Example 4

This example demonstrates the effect on dishing and erosion and on silicon nitride loss and oxide loss observed with a polishing composition comprising a polymer of formula I in accordance with an embodiment of the invention.

Separate patterned substrates comprising 100 μm and 900 μm silicon nitride features (approximately 1600 Å thick features) initially coated with approximately 1600 Å of oxide on silicon oxide-coated substrates having an oxide trench depth of approximately 3200 Å were polished with three different polishing compositions, Polishing Compositions 4A-4C. Each of Polishing Compositions 4A-4C were prepared by mixing equal volumes of wet-process ceria formulation WPC1 and an additive formulation. Polishing Composition 4A (comparative) was prepared using additive formulation F9. Polishing Composition 4B (comparative) was prepared using additive formulation F1. Polishing Composition 4C (invention) was prepared using additive formulation F3.

The substrates were polished to endpoint plus approximately 40% overpolishing. Following polishing, the silicon nitride loss in 100 μm features (expressed as delta nitride), the remaining trench oxide in 100 μm and 900 μm features, the erosion, and dishing were determined. The results are set forth in Table 6. The polishing time to endpoint and the overpolishing time are also indicated in Table 6.

TABLE 6

|  | Polishing Composition 4A (comparative) | Polishing Composition 4B (comparative) | Polishing Composition 4C (invention) |
| --- | --- | --- | --- |
| Endpoint + Overpolishing Time (s) | 78 + 31 | 27 + 6 | 24 + 10 |
| Delta Nitride | 261 | 48 | 52 |
| Remaining Trench Oxide (Å) (100 × 100 μm) | 1364 | 1823 | 1901 |
| Remaining Trench Oxide (Å) (900 × 900 μm) | 171 | 1616 | 1642 |
| Erosion (Å) | 389 | 197 | 149 |
| Dishing (Å) | 559 | 317 | 254 |

As is apparent from the results set forth in Table 6, Polishing Composition 4C (invention), which comprised 20 ppm of CAPSTONE™ FS-31, showed improved trench oxide protection on both 100 μm and 900 μm features. Relative to the inventive formulation 4C, the comparative examples 4A and 4B respectively show 72% and 96% of the trench protection shown by the inventive formulation 4C for the 100 μm feature. For the 900 μm feature, the comparative examples 4A and 4B respectively show 10% and 98% of the trench protection shown by the inventive formulation 4C. Polishing Composition 4C (invention) exhibited approximately 45% and 80% of the dishing and approximately 38% and 76% of the erosion exhibited by Polishing Compositions 4A and 4B (comparative), respectively.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) about 0.05 wt. % to about 10 wt. % of a ceria abrasive,
   (b) about 10 ppm to about 1000 ppm of a polymer of formula I:

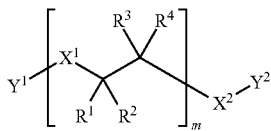

wherein $X^1$ and $X^2$ are independently selected from O, C, and S,
   $Y^1$ and $Y^2$ are independently selected from OH, $C_1$-$C_{10}$ alkyl, and a group of the formula: $C_xH_yF_z$,
   $R^1$, $R^2$, $R^3$, and $R^4$ are independently selected from hydrogen, F, $C_1$-$C_{10}$ alkyl, $C_6$-$C_{10}$ aryl, and heteroaromatic,
   x is an integer of 1 to about 20,
   z is an integer of 1 to about 41,
   m is an integer of about 3 to about 500, and
   at least one of $Y^1$ or $Y^2$ is $C_xH_yF_z$ or at least one of $R^1$-$R^4$ is F, and
   (c) water,
   wherein the polishing composition has a pH of about 1 to about 4.5.

2. The polishing composition of claim 1, wherein each of $Y^1$ and $Y^2$ is $C_xH_yF_z$.

3. The polishing composition of claim 1, wherein each of $X^1$ and $X^2$ is O.

4. The polishing composition of claim 1, wherein each of $R^1$, $R^2$, $R^3$, and $R^4$ is independently hydrogen or F.

5. The polishing composition of claim 1, wherein x is an integer of 1 to 9.

6. The polishing composition of claim 1, wherein x is an integer of 1 to 8 and y is an integer of 1 to 40.

7. The polishing composition of claim 1, wherein the polymer has a molecular weight of about 500 daltons to about 10,000 daltons, and wherein m is an integer with a value of 8 or greater.

8. The polishing composition of claim 1, wherein the polishing composition further comprises an ionic polymer selected from (a) an ionic polymer of formula II:

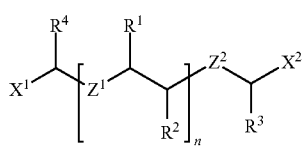

wherein $X^1$ and $X^2$ are independently selected from hydrogen, —OH, and —COOH, and at least one of $X^1$ and $X^2$ is —COOH,
   $Z^1$ and $Z^2$ are independently O or S,
   $R^1$, $R^2$, $R^3$, and $R^4$ are independently selected from hydrogen, $C_1$-$C_6$ alkyl, and $C_7$-$C_{10}$ aryl, and
   n is an integer of about 3 to about 500, and
   (b) a polyacrylate.

9. The polishing composition of claim 1, wherein the polishing composition further comprises a polyvinyl alcohol.

10. A method of chemically-mechanically polishing a substrate comprising:
    (i) contacting a substrate with a polishing pad and a chemical-mechanical polishing composition comprising:
       (a) about 0.05 wt. % to about 10 wt. % of a ceria abrasive,
       (b) about 10 ppm to about 1000 ppm of a polymer of formula I:

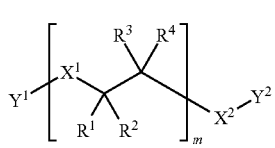

wherein $X^1$ and $X^2$ are independently selected from O, C, and S,
       $Y^1$ and $Y^2$ are independently selected from OH, $C_1$-$C_{10}$ alkyl, and a group of the formula: $C_xH_yF_z$,
       $R^1$, $R^2$, $R^3$, and $R^4$ are independently selected from hydrogen, F, $C_1$-$C_{10}$ alkyl, $C_6$-$C_{10}$ aryl, and heteroaromatic,
       x is an integer of 1 to about 20,
       z is an integer of 1 to about 41,
       m is an integer of about 3 to about 500, and
       at least one of $Y^1$ or $Y^2$ is $C_xH_yF_z$ or at least one of $R^1$-$R^4$ is F, and
       (c) water,
    wherein the polishing composition has a pH of about 1 to about 4.5,
    (ii) moving the polishing pad and the chemical-mechanical polishing composition relative to the substrate, and
    (iii) abrading at least a portion of the substrate to polish the substrate.

11. The method of claim 10, wherein each of $Y^1$ and $Y^2$ is $C_xH_yF_z$.

12. The method of claim 10, wherein each of $X^1$ and $X^2$ is O.

13. The method of claim 10, wherein each of $R^1$, $R^2$, $R^3$, and $R^4$ is independently hydrogen or F.

14. The method of claim 10, wherein x is an integer of 1 to 9.

15. The method of claim 10, wherein x is an integer of 1 to 8 and y is an integer of 1 to 40.

16. The method of claim 10, wherein the polymer has a molecular weight of about 500 daltons to about 10,000 daltons, and wherein m is an integer with a value of 8 or greater.

17. The method of claim 10, wherein the polishing composition further comprises an ionic polymer selected from (a) an ionic polymer of formula II:

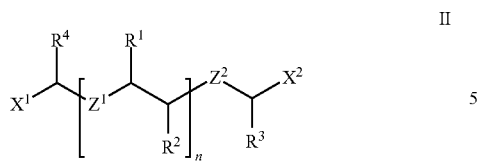

wherein $X^1$ and $X^2$ are independently selected from hydrogen, —OH, and —COOH, and at least one of $X^1$ and $X^2$ is —COOH, $Z^1$ and $Z^2$ are independently O or S, $R^1$, $R^2$, $R^3$, and $R^4$ are independently selected from hydrogen, $C_1$-$C_6$ alkyl, and $C_7$-$C_{10}$ aryl, and n is an integer of about 3 to about 500, and (b) a polyacrylate.

18. The method of claim 10, wherein the polishing composition further comprises a polyvinyl alcohol.

19. The method of claim 10, wherein the substrate comprises silicon oxide, and wherein at least a portion of the silicon oxide is abraded to polish the substrate.

20. The method of claim 19, wherein the substrate further comprises silicon nitride, and wherein at least a portion of the silicon nitride is abraded to polish the substrate.

21. The method of claim 19, wherein the substrate further comprises polysilicon, and wherein at least a portion of the polysilicon is abraded to polish the substrate.

* * * * *